United States Patent [19]
Phillips

[11] Patent Number: 6,127,868
[45] Date of Patent: Oct. 3, 2000

[54] TIMER CIRCUIT

[75] Inventor: William A. Phillips, Royal Oak, Mich.

[73] Assignee: STMicroelectronics, Inc., Carrollton, Tex.

[21] Appl. No.: 08/889,116

[22] Filed: Jul. 7, 1997

Related U.S. Application Data

[63] Continuation of application No. 08/717,618, Sep. 20, 1996, abandoned, which is a continuation of application No. 08/572,575, Dec. 14, 1995, abandoned.

[51] Int. Cl.[7] .................................................... H03K 3/12
[52] U.S. Cl. .......................... 327/205; 327/66; 327/206; 330/257
[58] Field of Search ..................... 327/205, 206, 327/65–67, 89; 330/252, 253, 257, 260, 288

[56] References Cited

U.S. PATENT DOCUMENTS

| | | | |
|---|---|---|---|
| 4,616,148 | 10/1986 | Ochii et al. | 327/55 |
| 4,779,016 | 10/1988 | Sugiyama et al. | 326/66 |
| 4,947,140 | 8/1990 | Tateishi | 331/113 R |
| 5,311,150 | 5/1994 | Engbretson et al. | 331/56 |
| 5,446,396 | 8/1995 | Brehmer | 327/66 |
| 5,495,207 | 2/1996 | Novof | 331/57 |
| 5,528,185 | 6/1996 | Lewicki et al. | 327/206 |
| 5,774,010 | 6/1998 | Kimura | 327/357 |
| 5,909,136 | 6/1999 | Kimura | 327/357 |

FOREIGN PATENT DOCUMENTS

| | | |
|---|---|---|
| 0 180 084 A2 | 5/1986 | European Pat. Off. . |
| 0 577 887 A1 | 1/1994 | European Pat. Off. . |

OTHER PUBLICATIONS

Lancaster, Dan., "Chapter 4: Multivibrators," *CMOS Cookbook*, 2nd ed., Prentice Hall Computer Publishing, 1993, pp. 297–304.

Wigmore, T., "More Applications For The 555", *Elektor Electronics*, 15(1989) Feb., No. 164, London, GB, pp. 24–28.

*Primary Examiner*—Kenneth B. Wells
*Attorney, Agent, or Firm*—David V. Carlson; Theodore E. Galanthay; Lisa K. Jorgenson

[57] ABSTRACT

The a timer circuit and oscillator are disclosed. The timer circuit is similar in functionality to a '555 timer circuit but uses few transistors. The timer circuit has two differential pairs of transistors, three current mirrors, two selectable current sources, and one inverter. The two differential pairs of transistors, three current mirrors, two selectable current sources, and one inverter are arranged to receive an IN+ voltage, an IN voltage, and a IN– voltage. From these inputs a Q and a Q(bar) output is generated. This timing circuit can be used to generate an oscillator by connecting a capacitor, a current source, and current drain to the IN voltage.

7 Claims, 4 Drawing Sheets

TIMER CIRCUIT

This application is a continuation of U.S. patent application Ser. No. 08/717,618, filed Sep. 20, 1996, now abandoned, which was a continuation of U.S. patent application Ser. No. 08/572,575, filed Dec. 14, 1995, now abandoned.

BACKGROUND OF THE INVENTION

1. Field of the Invention

This invention relates to electronic circuits used to generate timing signals and more specifically to circuits used to generate astable and monostable multivibrator such as '555 type timers.

2. Description of the Relevant Art

The problem addressed by this invention is encountered in circuits used for generating astable multivibrators. Astable multivibrators are commonly used, in combination with resistors and a capacitor to generate a square wave type signal. Such a square wave signal is used in many systems including computers, consumer electronic products, and automobiles.

A timer circuit that has a wide rage of astable and monostable possibilities is the low-power CMOS version of the 555 timer, manufactured as either an L555, XR555, or ICM7556. FIG. 1 shows the block diagram of an industry standard L555 as is known in the prior art. The circuit includes a comparator 2, a comparator 4, and a RS flip-flop 6. The RS flip-flop is typically constructed out of two nor gates, also shown in FIG. 1 as nor gates 8 and 10. FIG. 2 shows how the output Q is a function of the IN, IN+, and IN− inputs. These inputs can be controlled to determine the hysteresis of the circuit.

FIG. 3 shows in detail the prior art circuit typically used to implement the block diagram of the 555 timer circuit. Transistors 12–28 are configured as a typical comparator which corresponds to comparator 2 of FIG. 1. Similarly, transistors 30–46 correspond to comparator 4 of FIG. 1. Transistors 48–54 correspond to nor gate 8 and transistors 56–62 correspond to nor gate 10, both of FIG. 1. Resistor 64 and transistor 66 are necessary to provide the bias voltage to transistors 24 and 42. FIG. 3 also shows that 27 transistors are needed to use this circuit.

Therefore, it is an object of the invention to reduce the number of transistors used to make a timer circuit.

It is another object of the invention reduce the cost of a timer circuit by decreasing the number of transistors in the circuit.

It is and yet another object of the invention to increase the reliability of the circuit by decreasing the number of transistors in the circuit.

These and other objects, features, and advantages of the invention will be apparent to those skilled in the art from the following detailed description of the invention, when read with the drawings and appended claims.

SUMMARY OF THE INVENTION

The invention can be summarized as a timer circuit having two differential pairs of transistors, three current mirrors, two selectable current sources, and one inverter. The two differential pairs of transistors, three current mirrors, two selectable current sources, and one inverter are arranged to receive an IN+ voltage, an IN voltage, and a IN− voltage. From these inputs a Q and Q(bar) output is generated. This timing circuit can be used to generate an oscillator by connecting a capacitor, a current source, and current drain to the IN voltage.

DETAILED DESCRIPTION OF THE PREFERRED EMBODIMENT

Figure 1:
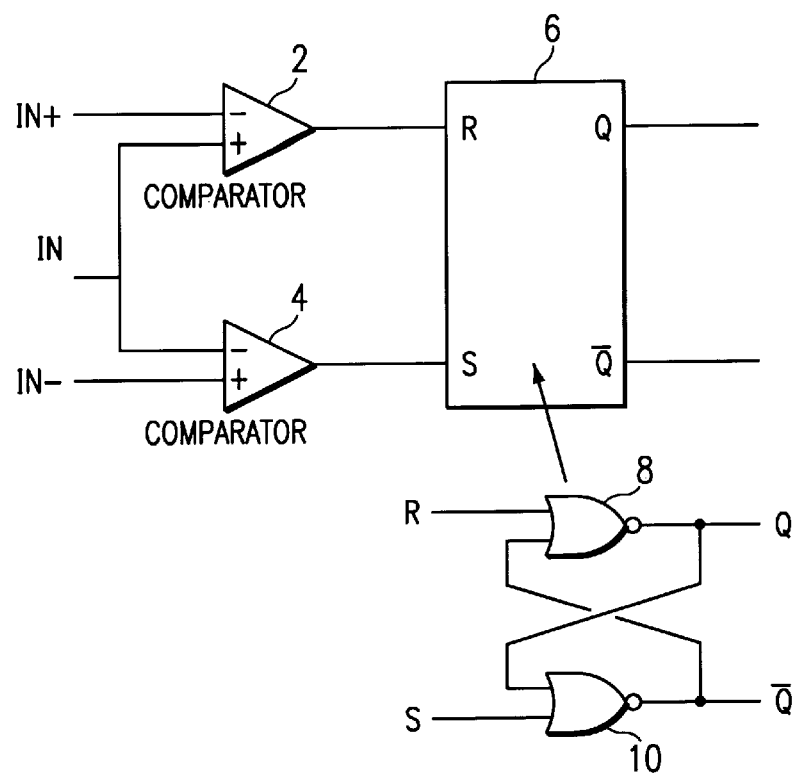
FIG. 1 is a block diagram of a timer circuit as known in the prior art.
Figure 2:
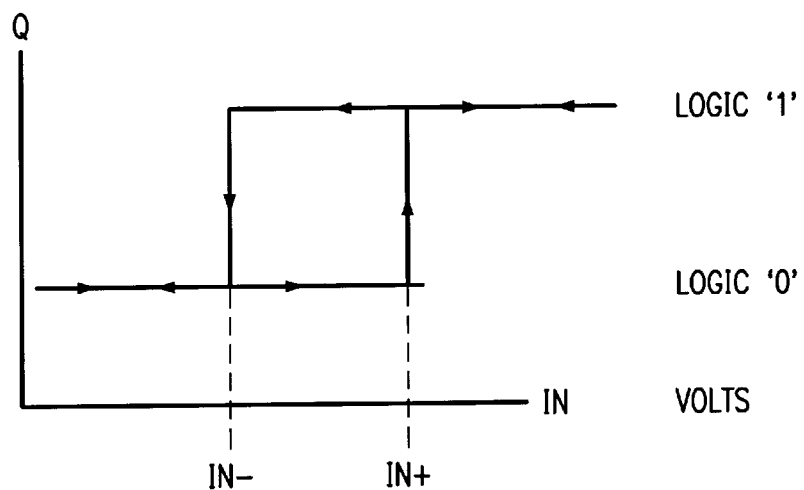
FIG. 2 is a output logic state vs input voltage graph for the timer circuit, as known in the prior art.
Figure 3:
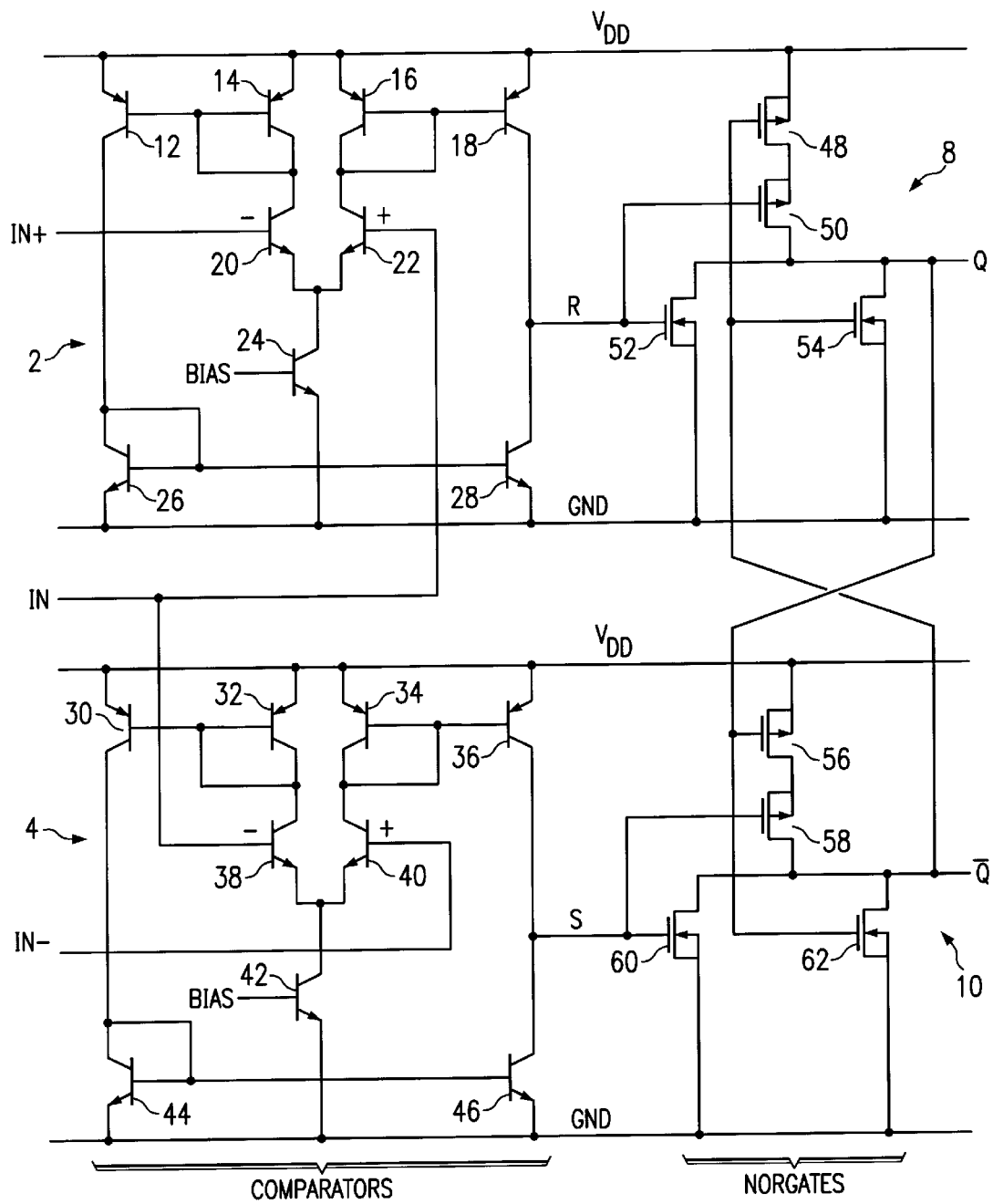
FIG. 3 is a schematic drawing of the timer circuit as known in the prior art.
Figure 3:
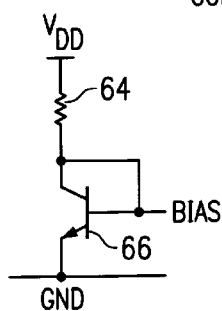
Figure 4:
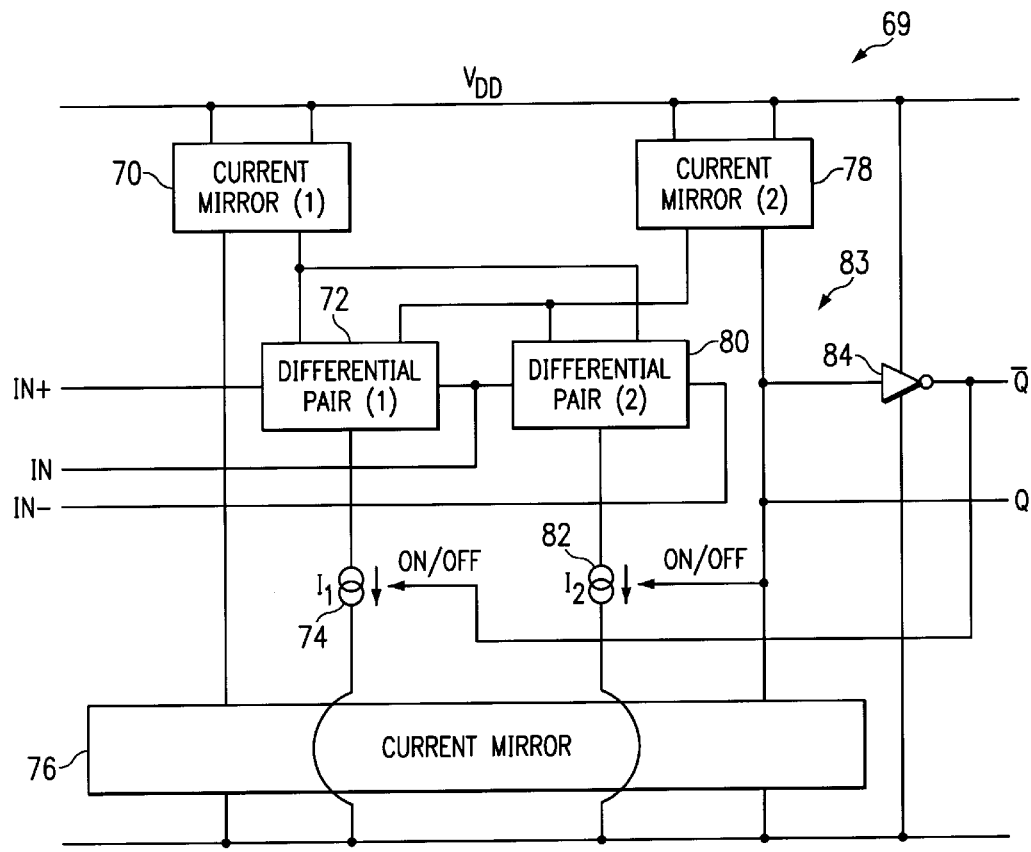
FIG. 4 is a block diagram of a timer circuit, as disclosed.

A timer circuit constructed according to an embodiment of the invention will now be described. FIG. 4 shows a block diagram of the timing circuit. The timing circuit has three inputs for receiving three input voltages; IN+, IN, and IN−. The timing circuit also has two outputs, Q and Q(bar). The block diagram shows the interconnections between the three current mirrors, 70, 78, and 76, the two differential pair of transistors 72 and 80, the two switchable current sources, 74 and 82, and the one inverter 84.

Current mirrors 70, 76, and 78 have a reference current and a mirrored current. This circuit is constructed by using current mirrors with a 1:1 current ratio between the reference current and the mirrored current. It is understood that this ratio is given as an example and that other ratios can be used by persons skilled in the art.

Figure 5:
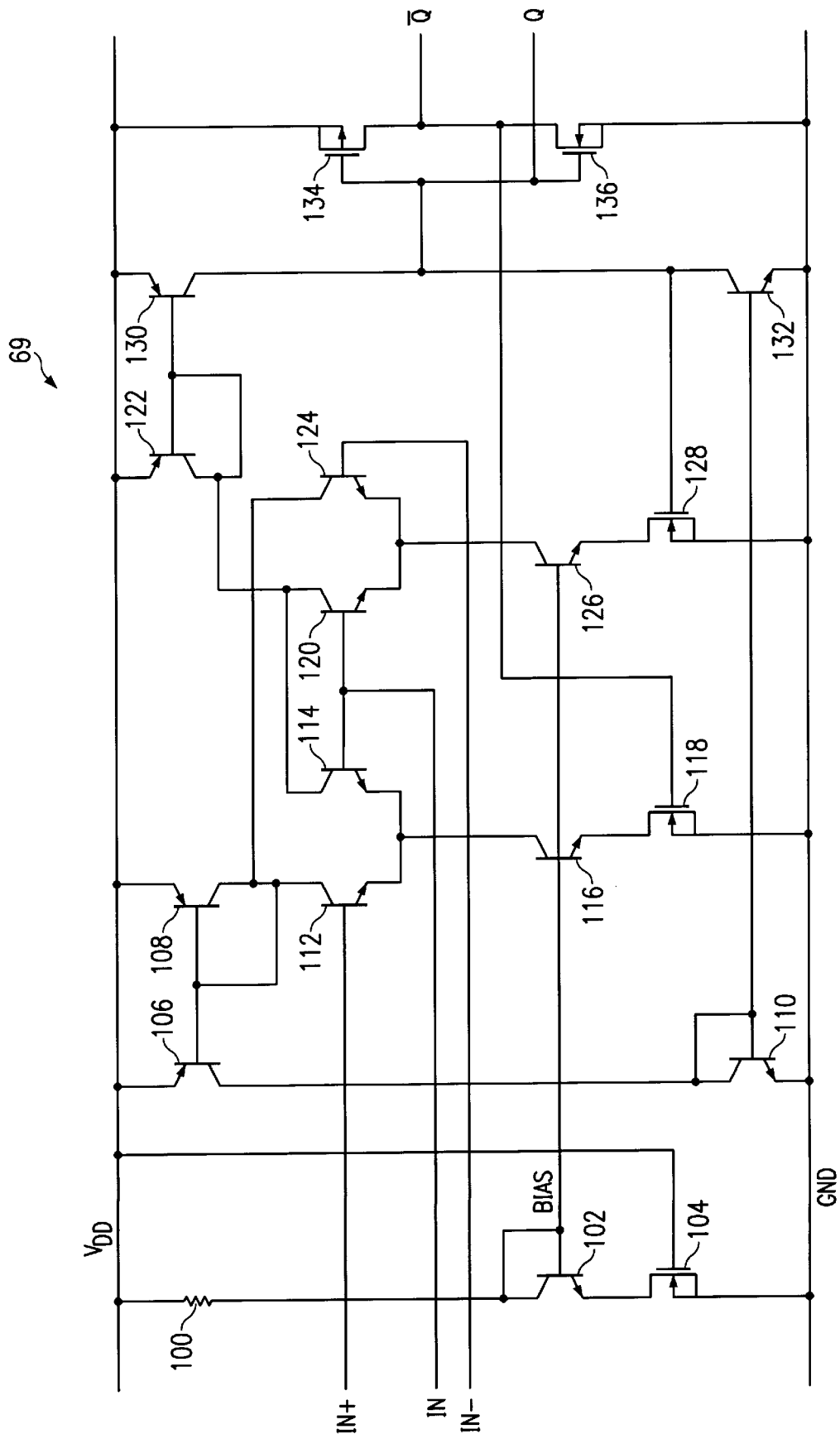
FIG. 5 is a schematic diagram of the timer circuit, as disclosed.

More specifically, the block diagram shows a first current mirror 70 having a mirrored current path between Vdd and the third current mirror 76. The reference current path for the first current mirror 70 is between Vdd and the first current path of differential pair 72 and the second current path of differential pair 80. The first and second current paths in a given differential pair correspond to first and second transistors, respectively, as is illustrated in FIG. 5. The second current mirror 78 has a reference current between Vdd and the second current path of the differential pair 72 and the first current path of differential pair 80. The mirrored current path of the second current mirror 78 is between Vdd and the input of inverter 84 and the mirrored current path of the third current mirror 76. This node 83 forms the output, Q, of the timing circuit. A first switchable current source 74 has a current path between the merged current path of the differential pair and ground. The merged current path of a differential pair is the node where the current of the first current path and the second current path meet in a differential pair of transistors. The first switchable current source is controlled by the output of inverter 84. A second switchable current source has a current path between the merged current path of differential pair 80 and ground. The second switchable current source 82 has a control element that is connected to node 83 (the output Q of the timing circuit).

In operation, when the IN voltage rises above the IN+ voltage, the second current mirror 78 will have more current than the first current mirror 70. Thus, the output Q will be driven high, turning on switchable current source 82 and turning off switchable current source 74. This latches the new logic state into the circuit. When the input voltage IN falls below IN−, the first current mirror 70 will have more current than the second current mirror 78. Therefore, the Q output will be driven low which turns on the first switchable current source 74 and turns off the second switchable current source 82, hence, latching in the second logic state. In short, persons skilled in the art will recognize that this circuit has the functionality of a typical '555 circuit has been emulated.

The block diagram can be summarized as having two differential pairs, only one of which is active at any given time. Thus, the disclosed circuit compares the voltage IN to IN+ when the output Q is high until IN exceeds IN+. Then, the output Q goes low and voltage IN is compared to IN−. When IN is falls below IN−, the output Q goes high and the cycle is repeated.

FIG. 5 shows a detailed schematic of the timing circuit necessary to implement the block diagram in FIG. 4. First current mirror 70 is implemented with PNP bipolar transistors 106 and 108. The second current mirror 78 is implemented using PNP bipolar transistors 122 and 130. The first differential pair 72 is implemented using NPN bipolar transistors 112 and 114. Similarly the second differential pair 80 is implemented using NPN bipolar transistors 120 and 124. The third current mirror 76 is implemented using NPN bipolar transistors 110 and 132. Inverter 84 is implemented using P-channel MOSFET transistor 134 and N-channel MOSFET transistor 136. Switchable current sources 74 and 82 are configured using transistors 116 and 118, and 126 and 128, respectively.

To construct the timing circuit in FIG. 5, the emitters of transistors 106, 108, 122, and 130 are connected to the supply voltage Vdd. The base of transistor 106 is connected to the base and collector of transistor 108 and to the collector of transistors 112 and 124. The collector of transistor 106 is connected to the collector and base of transistor 110 and the base of transistor 132. The emitters of transistors 110 and 132 are connected to ground. The base of transistor 112 receives the IN+ voltage while the base of transistor 124 receives the IN− voltage. The base of transistors 114 and 120 receive the IN voltage. The base of transistor 130 is connected to the base and collector of transistor 122, and to the collectors of transistors 114 and 120. The collector of transistor 130 is connected to the collector of transistor 132 and the gate of transistor 128 and to the gates of transistors 134 and 136. This node forms the output Q of the timing circuit. The emitters of transistors 112 and 114 are connected together and to the collector of transistor 116. The emitters of transistors 120 and 124 are connected together and to the collector of transistor 126. The bases of transistors 116 and 126 are connected to a bias circuit which is made up of transistors 102 and 104. The emitter of transistor 116 is coupled to the drain of transistor 118. The source of transistor of 118 is coupled to ground. The emitter of transistor 116 is coupled to the drain of transistor 128, the source of transistor 128 is coupled to ground. The gate of transistor 118 is coupled to the output Q[bar] while the gate of transistor 128 is coupled to the Q output.

The inverter 84 is made from transistors 134 and 136. The source of P-channel transistor 134 is connected to Vdd. The drain of transistor 134 is connected to the drain of transistor 136 and forms the Q[bar] output. The source of transistor 136 is connected to ground. The gate of transistor 134 and 136 are connected together and help form the output Q.

Persons skilled in the art will appreciate that this timing circuit has the same functionality of a '555 timing circuit but only uses 19 transistors compared to 27 transistors. By using 30% fewer transistors, the cost of the circuit is decreased while the reliability is increased. Therefore, the disclosed timing circuit is cheaper and more reliable the prior art timers.

Figure 6:
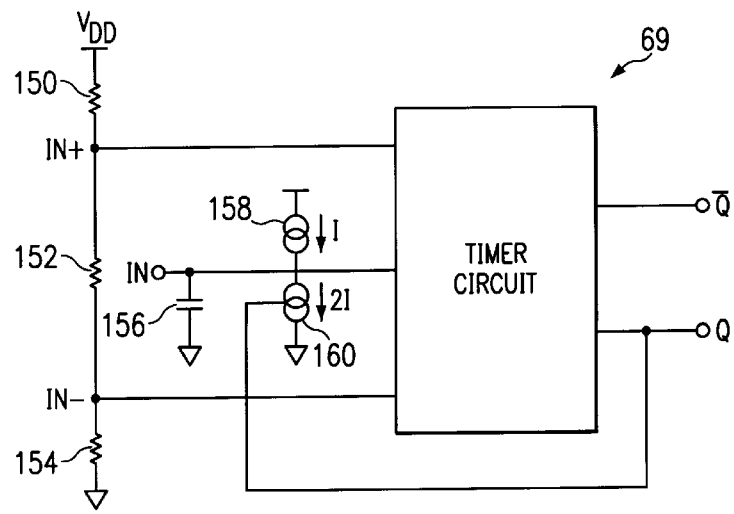
FIG. 6 is a schematic diagram of the timer circuit configured as an oscillator.

FIG. 6 shows timing circuit 69 being used as an oscillator. This oscillator is constructed by connecting resistors 150, 152, and 154 in series between a supply voltage Vdd and ground. Typical values for resistors 150, 152, and 154 are 20 Kohms, 60 Kohms, and 20 Kohms, respectively. This forms a voltage divider circuit which generates a voltage IN+ of about 3.5 volts and IN− of about 1.5 volts, assuming that Vdd is about 5 volts. The IN+ and IN− voltages are coupled to the appropriate inputs of the timing circuit 69. The IN voltage input is connected to the first plate of capacitor 156, which can be around 10 nanofarads. The second plate is connected to ground. The first plate of capacitor 156 is also connected to a current source 158 and a current drain 160. FIG. 6 shows current source 158 as being half the current capacity of current drain 160. It will be understood by persons skilled in the art that this ratio is arbitrary and that any ratio will work as long as the current drain capability of current drain 160 is larger than the current source capability of current source 158. Current source 158 is shown as a fixed current source or constant current source while current drain 160 is shown as being controllable by the output Q.

In operation, when the output Q is high, charge is being depleted from capacitor 156 by current drain 160 and therefore the voltage IN is going down at a rate proportional to the current drain 160 and the capacitance of capacitor 156. When the voltage IN falls below the voltage set up by the voltage divider IN−, then the timer circuit will switch states which turns off current drain 160. Therefore, current source 158 can charge up capacitor 156 thereby raising the voltage on the IN voltage input. When the IN voltage exceeds the IN+ voltage the timer circuit will again change states. By repeating this cycle the output of this oscillator is a square wave oscillating at a frequency proportional to the current sourcing and draining capability of current source 158 and current drain 160, respectively, and the capacitance of capacitor 156.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A comparison circuit comprising:

first and second differential pairs, each having a first current path with a control element, a second current path with a control element, and a merged current path coupled to a ground voltage;

a first current mirror for providing a mirrored current source coupled from a supply voltage line to the first current path of the first differential pair, and coupled to the second current path of the second differential pair; and a second current mirror for providing a mirrored current source coupled from the supply voltage line to the second current path of the first differential pair, and coupled to the first current path of the second differential pair;

a first reference node coupled to the control element of the first current path of the first differential pair, the first reference node for receiving a first reference signal;

a second reference node coupled to the control element of the second current path of the second differential pair, the second reference node for receiving a second reference signal;

a testing node coupled to the control element of the second current path of the first differential pair and coupled to the control element of the first current path of the second differential pair, the testing node for receiving a testing signal;

wherein the current drawn through the second current mirror based on the testing signal in conjunction with the second reference signal is to be compared to the current drawn through the first current mirror based on the first reference signal in conjunction with the testing signal; and wherein the current drawn through the second current mirror based on the testing signal in conjunction with the first reference signal is to be compared to the current drawn through the first current mirror based on the second reference signal in conjunction with the testing signal.

2. A comparison circuit comprising:

first and second differential pairs, each having a first current path with a control element, a second current path with a control element, and a merged current path coupled to a ground voltage;

a first current mirror for providing a mirrored current source coupled from a supply voltage line to the first current path of the first differential pair, and coupled to the second current path of the second differential pair; and a second current mirror for providing a mirrored current source coupled from the supply voltage line to the second current path of the first differential pair, and coupled to the first current path of the second differential pair;

a first switchable current source with a control element coupled between the merged current path of the first differential pair and the ground voltage;

a second switchable current source with a control element coupled between the merged path of the second differential pair and the ground voltage; and wherein the current flowing through the current mirrors can be compared and a comparison signal generated, and wherein the comparison signal is coupled to the control elements of both switchable current sources and adapted to alternately enable one or the other of the switchable current sources.

3. The comparison circuit of claim 2 wherein the switchable current sources are field effect transistors.

4. The comparison circuit of claim 2, further comprising an inverter having an input and output wherein the input is coupled to the comparison signal and wherein the output is coupled to the control element of one of the switchable current sources and the comparison signal is connected to the control element of the other switchable current source.

5. The comparison circuit of claim 4 wherein the inverter is formed with one P-type MOS transistor and one N-type MOS transistor.

6. The comparison circuit of claim 2 wherein both current mirrors contain a reference path and a mirrored path.

7. The comparison circuit of claim 2 wherein each current mirror is connected to the differential pairs via the reference path.

* * * * *